(12) United States Patent
Lowrance et al.

(10) Patent No.: US 6,642,495 B2
(45) Date of Patent: Nov. 4, 2003

(54) OPTICAL PULSE COUNTING IMAGER AND SYSTEM

(75) Inventors: John L. Lowrance, Princeton, NJ (US); George F. Renda, Princeton, NJ (US)

(73) Assignee: Princeton Scientific Instruments, Monmouth Junction, NJ (US)

( * ) Notice: Subject to any disclaimer, the term of this patent is extended or adjusted under 35 U.S.C. 154(b) by 0 days.

(21) Appl. No.: 09/781,084

(22) Filed: Feb. 12, 2001

(65) Prior Publication Data

US 2002/0109072 A1 Aug. 15, 2002

(51) Int. Cl.$^7$ .................................................. H01L 27/00
(52) U.S. Cl. .................................. 250/208.1; 348/222.1
(58) Field of Search ........................ 250/208.1; 348/307, 348/308, 301, 281, 222

(56) References Cited

U.S. PATENT DOCUMENTS

| | | | | |
|---|---|---|---|---|
| 5,151,588 A | * | 9/1992 | Kiri et al. ................. | 250/208.1 |
| 5,665,959 A | * | 9/1997 | Fossum et al. ........... | 250/208.1 |
| 5,812,191 A | * | 9/1998 | Orava et al. ................. | 348/308 |
| 6,248,990 B1 | * | 6/2001 | Pyyhtia et al. ........... | 250/208.1 |
| 6,389,102 B2 | * | 5/2002 | Mazor et al. ................. | 378/89 |

* cited by examiner

Primary Examiner—Que T. Le
Assistant Examiner—Eric J Spears
(74) Attorney, Agent, or Firm—Henry I. Schanzer

(57) ABSTRACT

A matrix array of photo elements (pixels) arranged in rows and columns with at least one row conductor per row of the matrix and a column conductor per column of the matrix for selectively the pixels. Each pixel of the matrix array includes: (a) a photodetector for detecting light pulses incident on the pixel and producing an output signal indicative of an incident light pulse; (b) signal processing circuitry coupled to the photodetector and responsive to its output signal for generating an electrical pulse corresponding to each incident light pulse; and (c) counting circuitry coupled to the signal processing circuitry for storing information indicative of the number of light pulses incident on the photodector during a sensing period. Row and column decoders are respectively coupled to the row and column conductors of the matrix array for reading out the contents of the array a row at time and for resetting the pixels of each row after their contents have been read out.

22 Claims, 5 Drawing Sheets

Figure 1 - PRIOR ART

OPTICAL PULSE COUNTING IMAGER AND SYSTEM

BACKGROUND OF THE INVENTION

This invention relates to solid state imaging circuitry and systems and to methods for operating the circuitry and system.

To better understand the invention and a problem resolved by the invention reference is made to FIG. 1 which depicts a large two dimensional (matrix) array of image sensing elements (pixels) arranged in rows and columns. Assume, for purpose of illustration, that the array is comprised of 100 rows and 100 columns with one picture element (pixel) located at the intersection of each row and column. Assume further that bursts of light pulses, representing the information to be sensed, are to be detected (sensed) by the matrix array. For purpose of illustration assume that there are bursts of light pulses with the repetition rate of the light pulses within a burst of pulses being 33,000 pulses per second (i.e., the time interval, or period, between light pulses within a burst of pulses is 30 microseconds, corresponding to a frequency of approximately 33 KHz). To be able to sense the occurrence of each individual light pulse sensed by any one of the 10,000 pixels comprising the 100×100 pixel matrix array, a conventional (prior art) matrix array has to be operated at a rate of 330 MHz. (i.e., 33 KHz times the 10,000 pixels in the array).

Consequently, the matrix array has to be operated at a high frame rate (33 KHz) and the information has to be sensed and processed at a very high video bandwidth. Operating the array at such high frame rate and bandwidth is problematic. This problem is further aggravated when it is desirable and/or necessary to use a larger matrix array (e.g., a 256 by 256 array of photo elements). Using known arrays of photo elements and known techniques for operating these arrays require very high operating clock rates and very high speed of data transmission which is difficult, if not impossible, to effectuate.

The problems associated with known prior art arrays of image sensing elements and the operation of these arrays are overcome in systems embodying the invention.

SUMMARY OF THE INVENTION

The problems associated with the known prior art arrays of image sensing elements and their operation are overcome in systems embodying the invention by using a novel array of "smart pixels" embodying the invention.

The pixels used to practice the invention are denoted as "smart" in that each pixel of an image sensing array embodying the invention includes the ability to detect (sense) the receipt of optical pulses during a sampling interval and to generate and store within each pixel an indication of the number of optical pulses detected or sensed by the pixel during the sampling interval (frame time).

In one embodiment, each pixel has associated with it a photodetector to sense an incident light pulse and an analog voltage counter to count and store the number of light pulses detected by each pixel, during a sampling interval. The analog voltage counter generates a voltage whose amplitude corresponds to the number of pulses detected by the photodetector during the sampling interval. That is, each pixel is designed to count the number of light pulses detected by the pixel during a "sampling interval" and to store a voltage corresponding to the count. Following each sampling interval, the data sensed and stored by each pixel is read out and the analog voltage counter is reset to an initial condition. Since each pixel includes means for storing a voltage corresponding to the number of light pulses sensed by the pixel, the pixels can be read out at a moderate frame rate.

In another embodiment of the invention, the number of light pulses detected during a sampling interval are stored in a digital counter.

Image sensors embodying the invention are comprised of an array of smart pixels with each smart pixel including a photodetector, for detecting optical pulses, and circuitry for processing the electrical signal generated by the photodetector. The signal processing circuitry is designed and tailored to respond to optical pulses in order to count only those pulses having a predetermined characteristic and means for counting and storing the detected light pulses.

Image sensors embodying the invention may also include circuitry for operating the array such that each pixel of the array detects incoming light pulses for a sampling interval with the information acquired by each pixel during a sampling interval being subsequently read-out during a read interval.

The "smart pixel" concept greatly reduces the video bandwidth and raw data processing rate required to detect and locate low intensity light pulses (lasers) in a wide field-of-view.

In one embodiment, each pixel is provided with a photodetector, a transimpedance amplifier and a high-pass circuit to detect and count short optical pulses superimposed on a bright background. Each smart pixel includes counting means for counting multiple optical pulses to provide a means for discriminating bursts of optical pulses from cosmic rays and other single event noise sources.

The pixel array may be read out by conventional x-y addressing of each pixel. In one embodiment using an analog voltage counter, the readout process consists of reading an analog voltage level that is related to the number of pulses detected since the last time the pixel was read out and reset. When the output signal voltage has been read, the voltage level is reset to a reference value representing zero detected pulses.

BRIEF DESCRIPTION OF THE DRAWINGS

In the accompanying drawing like reference characters denote like components.

DETAILED DESCRIPTION OF THE INVENTION

Figure 1:
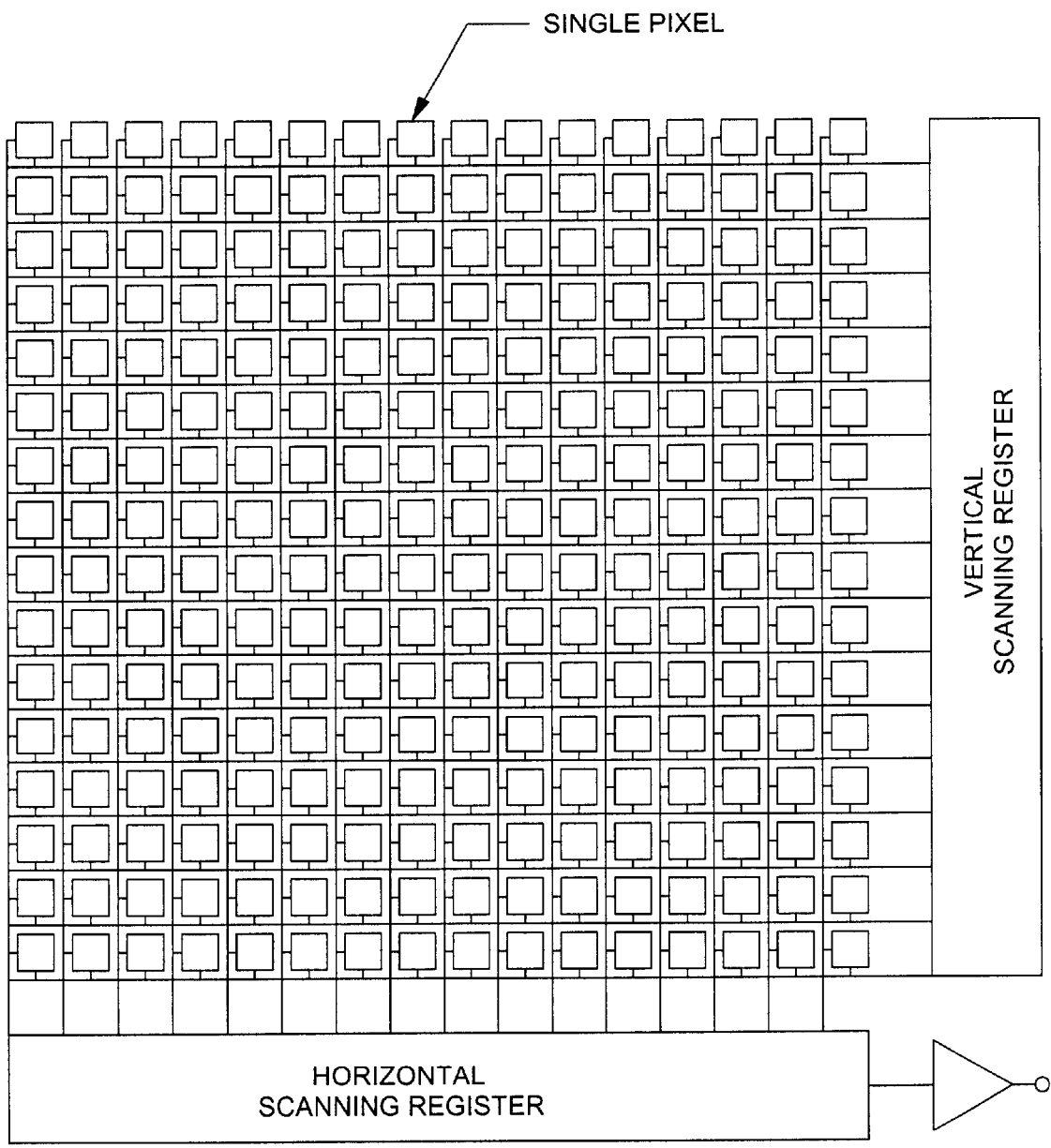
FIG. 1 is a simplified block diagram of a prior art imaging sensor.
Figure 2:
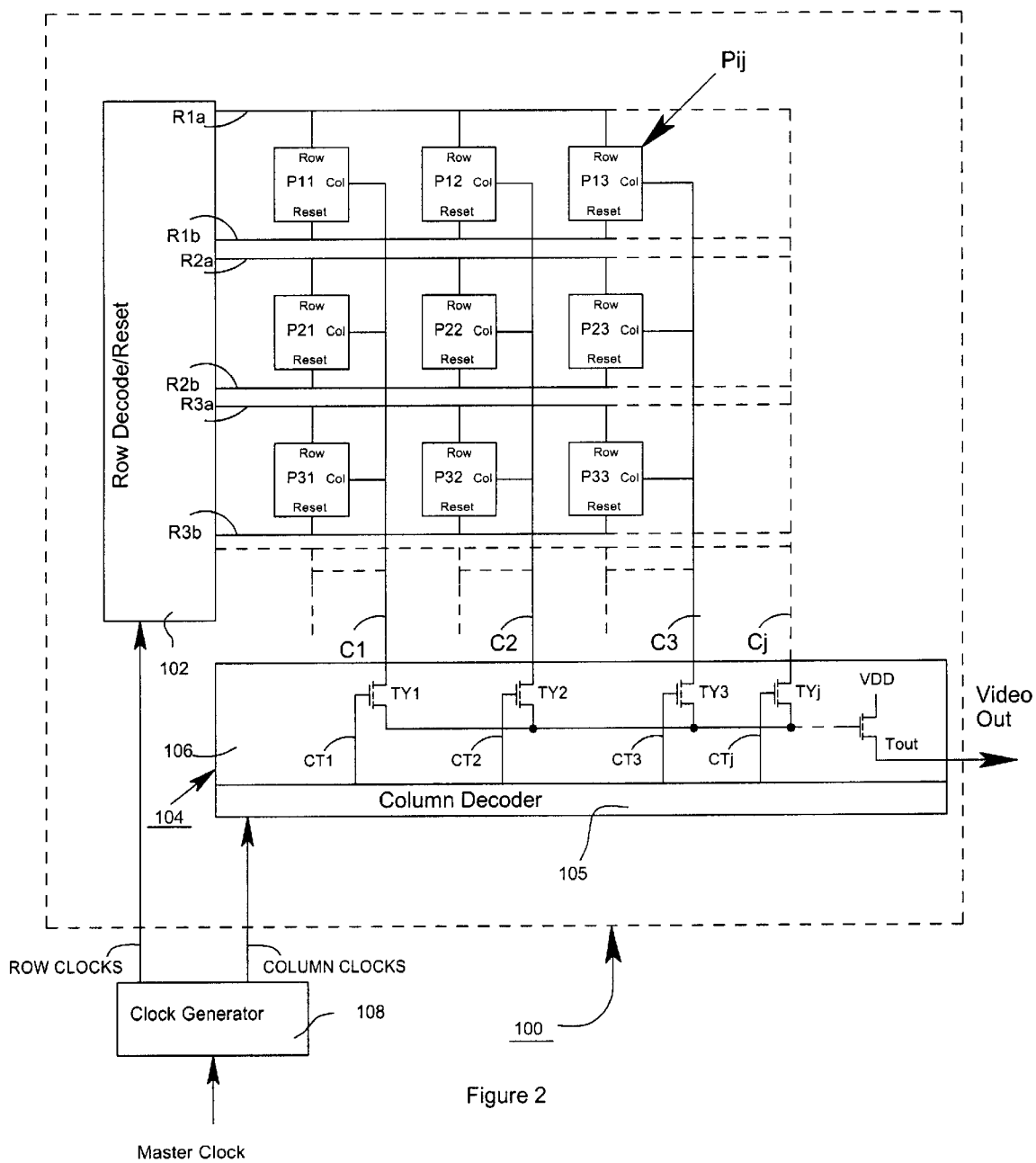
FIG. 2 is a simplified block diagram of a portion of a matrix array of smart pixels embodying the invention.

Referring to FIG. 2, there is shown a block diagram of 3 rows and 3 columns of an imager array 100 containing smart pixels Pij, embodying the invention, where "i" refers to the order of the row and "j" refers to the order of the column. The imager 100 may be comprised of "R" rows and "C" columns, where R and C may be any integer greater than 2. However, for ease of description, only 3 rows and 3 columns are shown in detail. Each row may be selected and controlled by means of two row conductors Ria, Rib; and each column may be selected and controlled by means of a column conductor Cj. The row conductors (Ria, Rib) are selected by means of a row decoder 102. Typically, as detailed below, one of the two row conductors of a row is used to select its associated row and the other one of the two row conductors is used to reset the pixels of its associated row. The column conductors (Cj) are selected by means of column control circuit 104 which includes a column decoder 105 and a column read out selector 106, with control circuit 104 being responsive to column clock signals. Typically, only one column conductor per column may be required. However, depending on the structure of the array two column conductors per column may be used to operate the array. Column decoder 105 and column read-out selector 106 may be combined into a single decoding selecting and read-out unit 104 as shown in FIG. 2. The operation of the row and column decoders is controlled by means of a clock generator circuit 108 which in response to a master clock signal generates row clock signals supplied to the row decoder 102 and column clock signals supplied to the column decoder 105. Row decoder 102 generates the signals for selectively enabling/disabling selected row conductors. Column decoder 105 generates the signals for selectively enabling/disabling selected column lines (CTj) which in turn enable corresponding column conductors Cj. That is, the CTj signals are applied to the gates of corresponding TYj transistors whose conduction paths couple their respective column conductors Cj to the gate of an output transistor Tout to produce a video output signal at the source of Tout. In one embodiment, the imaging matrix array, together with the row decoder 102 and the column decoder and read-out unit 104 are all formed on a single integrated circuit (IC). That is, the imaging array may be a single IC. In addition, all, or selected portions, of the clock generator circuit 108 may also be formed on the same IC.

As illustrated in FIGS. 3, 6, and 7–9, the pixels Pij of the array 100 are referred to as "smart pixels" in that each pixel of the array includes: (a) a photodetector 12 which may be a photodiode or any other suitable light responsive device. Photodetector 12 is used to detect (sense) light pulses (photons) incident on the photodetector 12 and to generate electrical signals in response to the incident photons; and (b) circuitry for processing the detected light pulses, counting them and storing the number of pulses during a set time interval.

Figure 3:
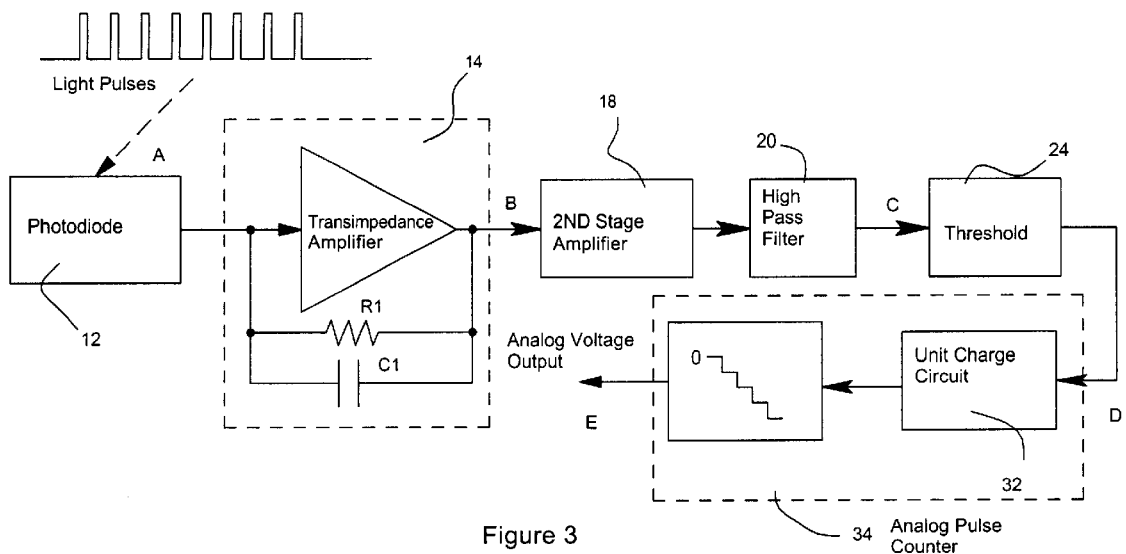
FIG. 3 is a partial block, partial schematic, diagram of components contained within a smart pixel embodying the invention.
Figure 4:
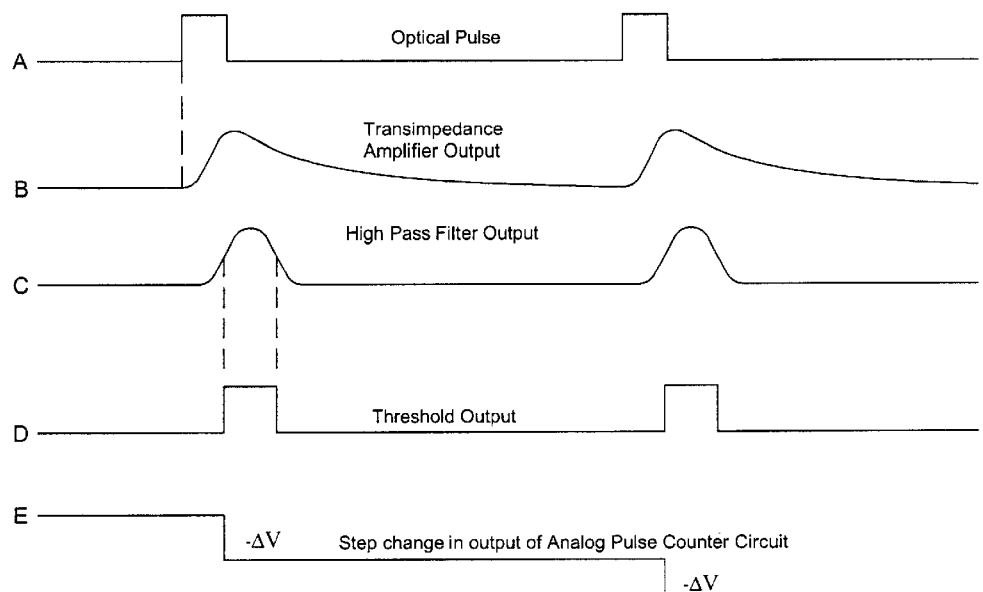
FIG. 4 is a waveform diagram associated with the operation of the circuit of FIG. 3.
Figure 5:
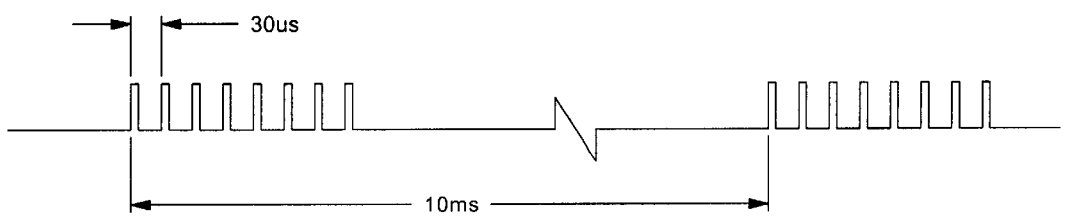
FIG. 5 is a waveform diagram of optical light pulses which may be applied to image sensors embodying the invention.
Figure 6:
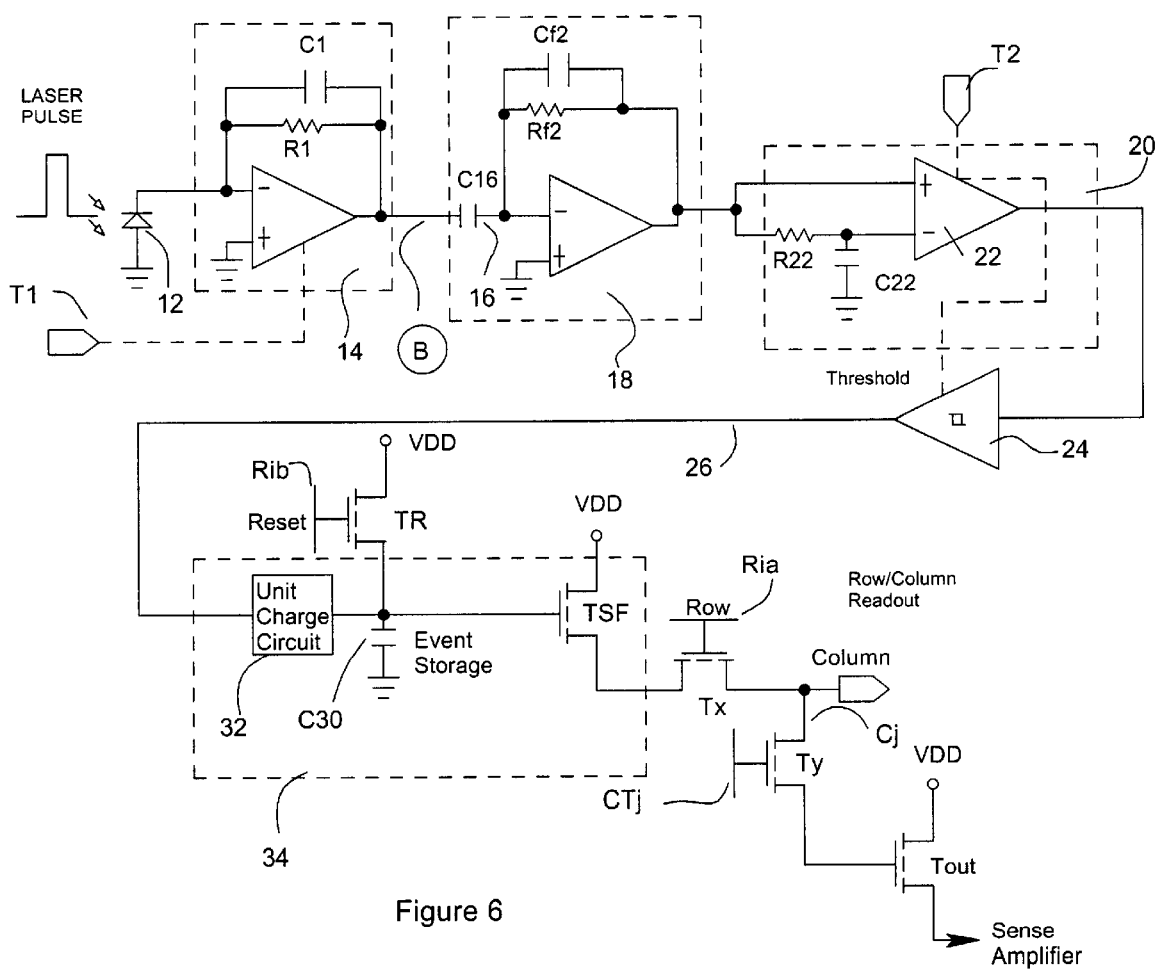
FIG. 6 is a more detailed schematic diagram of a smart pixel embodying the invention.

One embodiment of a "smart pixel" embodying the invention is shown in block form in FIG. 3 which is a simplified partial block, partial schematic, diagram of a smart pixel. In one embodiment all the elements of the pixel shown in block form in FIG. 3 and in more detail in FIG. 6 were formed and integrated in a contiguous area on the same integrated IC. A portion of each pixel area is occupied by a photodetector 12 which converts photons into photoelectrons. Where the photodetector 12 is a photodiode, as shown in FIG. 6, the photoelectrons are collected by an electrode (cathode) of the photodiode 12 which is connected to the input of an amplifier 14. Photodetector 12 is responsive to light pulses (see, for example, the bursts of pulses shown in FIG. 5) which may, for example, be produced by a laser light source. The output of the photodetector 12 is supplied to a first transimpedance amplifier circuit 14 having an output-B at which may be produced a signal of the form shown in waveform B of FIG. 4. Amplifier 14 functions as an integrator and helps to determine the pulse response of the pixel circuit. The output-B of amplifier 14 is coupled to the input of a second amplifier circuit 18 whose output is coupled to a high-pass amplifier/filter circuit 20 having an output-C at which may be produced a signal having the form shown in waveform C of FIG. 4. The output-C of the high pass filter 20 is coupled to a threshold circuit 24 having an output-D at which may be produced as signal having the form shown in waveform D of FIG. 4. The output-D is applied to a unit charge circuit 32 whose output is applied to an analog pulse counter 34. The frequency response of the high-pass amplifier/filter 20 is tailored to amplify high frequencies and not low frequencies. Thus, an optical pulse produced by the photodetector 12, which may be of the type shown in waveform A of FIG. 4, when applied to the input of amplifier 14 will generate a pulse at node "B", of the type shown in waveform B of FIG. 4. The pulse produced at the output of amplifier 14 (waveform B) may be further amplified by circuit 18 and may then be filtered by the high-pass circuit 20. The output of the filter/amplifier 20 may then be compared to a reference "threshold" voltage in threshold circuit 24 to determine whether the incoming optical pulse has the requisite energy profile. When the amplitude of the pulse in waveform C exceeds the reference threshold voltage, indicating that the received light pulse meets predetermined characteristics, circuit 24 is triggered to produce a pulse of fixed amplitude as shown in waveform D of FIG. 4. Each output pulse from threshold circuit 24 is applied to unit charge circuit 32. The unit charge circuit 32 functions to discharge (or charge) a fraction of the charge on a storage capacitor (e.g., C30) in analog counter 34, as shown in waveform E of FIG. 4. The discharge (or charge) of the charge stored in the storage capacitor (e.g., C30 in FIG. 6) causes a change in the voltage across the storage capacitor. The amplitude of the voltage across the storage capacitor defines the output voltage of the pixel and corresponds to the number of light pulses sensed by the photodetector during a sampling (or sensing) interval. The "signal" voltage stored on the storage capacitor may be read and the storage capacitor may then be reset to a zero signal condition by X-Y addressing of the pixel. Following the readout of each pixel, the pixel is "reset" and then can count the number of incident light pulses during a predetermined sampling (or sensing) interval, after which the contents of the pixel are again readout and the pixel reset.

A more detailed embodiment of the smart pixel of FIG. 3 is shown in FIG. 6. The output of the photodetector 12 is applied to an input of a transimpedance amplifier 14 whose output is AC coupled via a capacitor 16 to an input of an operational amplifier 18 whose output is supplied to the input of a high-pass filter 20. The high-pass filter 20 includes a differential amplifier 22 having its positive input connected to the output of amplifier 18 and having its negative input terminal connected via a delay network (R22 and C22) to the output of amplifier 18. The output of high-pass circuit 20 is supplied to a threshold circuit 24 which produces a "threshold" pulse of fixed amplitude when the signal at the output of detector 20 exceeds a predetermined level. Each threshold pulse triggers the unit charge circuit 32 and causes a storage capacitor C30 to be discharged (or charged) by a given amount of charge. Then, as shown in waveform E of FIG. 4, for the embodiments of FIGS. 3 and 6, each time an optical pulse is sensed, the voltage across the capacitor is decreased by a predetermined amount (e.g., $-\Delta V$).

In FIG. 6, there is shown a voltage bias source T1, connected to amplifier 14 to control the operating current of the amplifier in order to selectively set its operating point and gain. Likewise, there is shown a voltage bias source T2 which is connected to amplifier 22 and threshold circuit 24 to control their operating current in order to selectively set their operating points and gain levels.

To illustrate a mode of operation of each pixel, assume that, at the onset of a sampling (sensing) interval, the capacitor C30 is recharged to VDD volts, where VDD volts may be assumed to be the operating voltage (e.g., 3 volts) of the pixel circuitry. The recharging of C30 to VDD volts may be accomplished by momentarily enabling a reset transistor TR whose gate electrode is connected to a row conductor Rib (see FIG. 2) and whose conduction path is connected between VDD and the top side of capacitor C30. The turn-on and turn-off of transistor TR is controlled by a signal applied to its corresponding row conductor Rib which is connected to the gate electrode of transistor TR. Before each sampling (sensing) interval, transistor TR is turned-on momentarily and C30 is recharged to VDD volts. Thereafter, during a sampling (sensing) interval capacitor C30 is partially discharged each time an optical pulse meeting predetermined characteristics is detected. At the end of the sampling interval the voltage present across capacitor C30 is sensed. For the embodiment shown in FIG. 6, a source follower transistor TSF is connected at its gate electrode to the top side of capacitor C30, at its drain to VDD volts and at its source to one end of the conduction path of a transmission gate transistor TX. Therefore, the voltage at the source of TSF is equal to the "signal" voltage at the top side of capacitor C30 (less the gate-to-source threshold voltage of TSF). A row conductor Ria is connected to the gate of a switching (gating) transistor TX. The potential applied via row conductor Ria to the gate of Tx controls the turn-on and turn-off of Tx. When TX is turned-on, the signal voltage at the source of TSF is applied to the pixel's corresponding column conductor Cj. The voltage applied to the column conductor Cj can then be coupled via the conduction path of a corresponding column transistor TY to the input of an output buffer transistor (Tout in FIG. 2) for producing a video output signal. Transistor TY is turned on and off by means of a signal CTj (see also FIG. 2) applied to the gate electrode of TY. When TY is turned-on by signal CTj it couples the signal voltage present on column "j" to the gate of Tout which then produces at its source the video output signal which may be applied to a sense amplifier (not shown). Following the read out of the data stored on capacitor C30, capacitor is reset and a new sampling (sensing) interval is initiated.

Figure 7:
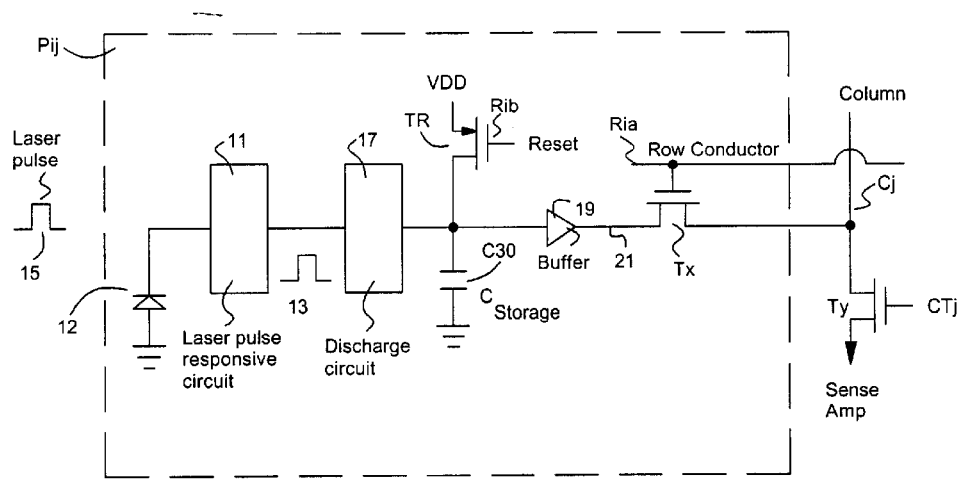
FIGS. 7 and 8 are simplified block diagrams of smart pixels with analog counting circuitry embodying the invention.
Figure 8:
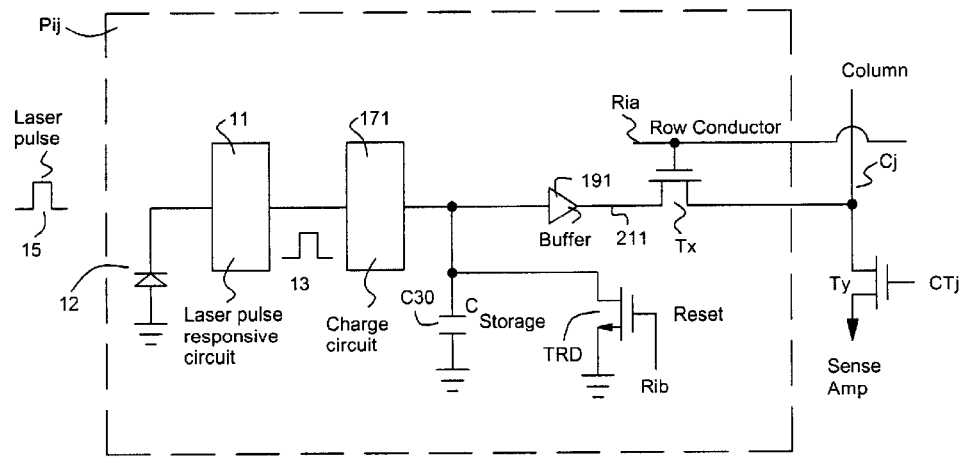
Figure 9:
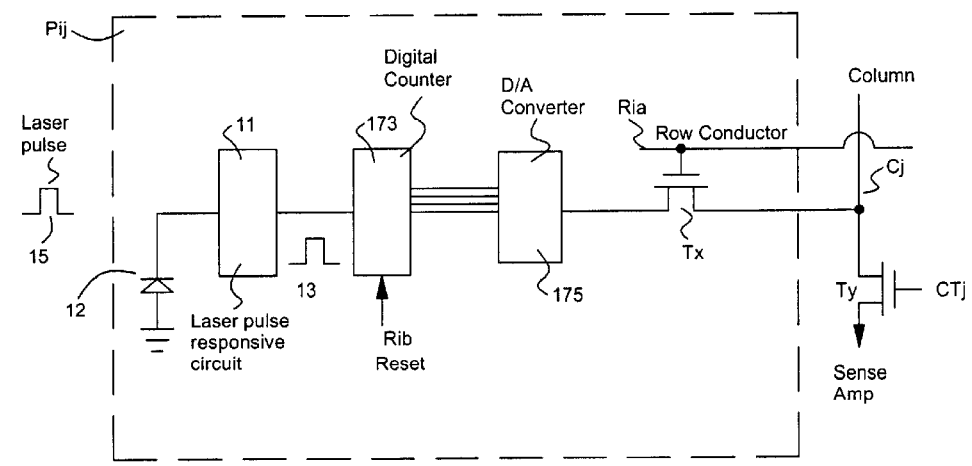
FIG. 9 is a simplified block diagram of a smart pixel with a digital counter embodying the invention.

Various embodiments of pixels (Pij) embodying the invention are shown in FIGS. 7, 8, and 9. In FIGS. 7 and 8, the storage capacitor C30 functions as an analog counter to count and store the number of light pulses detected during a sampling (sensing) interval.

In FIGS. 7 and 8, the photodector 12 is coupled to a light pulse responsive circuit 11 which functions to produce an electrical pulse 13 corresponding to incident laser pulses 15. The light (laser pulse) responsive circuit 11 may include any suitable circuitry for converting a received light pulse to a voltage (electrical) pulse. The circuitry 11 may include amplifiers such as 14 and 18, a high pass filter such as amplifier/filter 20 and a threshold circuit such as threshold 24, as shown in FIGS. 3 and 6.

In FIG. 7, successive optically induced voltage pulses that exceed the threshold and trigger the unit charge circuit, result in further removal of charge from the output voltage capacitor C30 and the output voltage decreases correspondingly. In FIG. 7, the electrical pulse 13 is supplied to a discharge circuit 17 which causes the storage capacitor C30 to be discharged by a corresponding unit amount of charge corresponding to each electric pulse. The voltage across capacitor C30 is applied to a buffer 19 which may be a source follower or any suitable linear amplifier to produce a signal at its output 21 corresponding to the voltage across C30, which voltage corresponds to the number of laser light pulses sensed by photodetector 12 and supplied to circuit 11. The output of buffer 19 can be selected for read out via the conduction path of a row conductor gating switch TX and transferred to a corresponding column conductor Cj. The turn-on and turn-off of switch TX is controlled by a signal applied from row decoder 102 to row conductor Ria which is connected to the gate electrode of TX. When TX is turned-on, the output signal transferred to the column conductor Cj may then be coupled to sensing circuitry via a column conductor gating switch transistor TY. The turn-on and turn-off of transistor TY is controlled by a signal applied to column control line CTj connected to the gate electrode of TY. When TY is turned on the column conductor carrying the signal from the pixel is either applied to the gate of an output transistor Tout as shown in FIG. 2 of may be coupled via other circuitry to a separate sense amplifier. After the readout of the signal indicative of the number of received light pulses, a reset transistor TR is momentarily energized to recharge capacitor C30 to the operating supply voltage, VDD volts. The turn-on and turn-off of transistor TR is controlled by a signal applied from row decoder 102 to a row conductor Rib which is connected to the gate electrode of TR. Transistor TR is momentarily turned after each read-out of the pixel and/or immediately before the initiation of a sampling (sensing) interval. Once reset (i.e., recharged to VDD volts), capacitor C30 is ready to respond and store a signal corresponding to the number of incoming laser pulses. In FIG. 7, C30 senses and stores the occurrence of each incoming laser pulse by means of circuitry discharging the capacitor by a predetermined amount of charge each time a laser pulse is sensed.

In FIG. 8, the laser pulse responsive circuit 11 is coupled to a charge circuit 171 which produces a unit charging pulse charging capacitor C30 by a positive going incremental change in voltage ($+\Delta V$) for each electrical pulse 13 produced as a result of a laser light pulse 15. Thus, in FIG. 8 the voltage across capacitor C30 increases incrementally for each light pulse detected by the circuit 11 and 171 during a sampling interval. Similarly to the circuit of FIG. 7, a buffer amplifier 191 produces a voltage at its output 121 corresponding to the voltage across C30. The voltage at the output of the amplifier 191 can then be coupled via the conduction path of a row (gating) transistor switch TX controlled by a row conductor signal and via a column transistor switch TY controlled by a column conductor signal to a sense amplifier or to the gate of a transistor Tout, as shown in FIG. 2. Also, in a complementary manner to the case of FIG. 7, the charge across capacitor C30 and the corresponding voltage may be discharged to, or close to, zero volts after read out of the accumulated signal. In FIG. 8, the discharge of capacitor C30 may be accomplished by means of a transistor TRD having its conduction path connected across capacitor C30 and having its gate connected to a row conductor Rib. In response to a signal from row decoder 102 (see FIG. 2) transistor TRD is momentarily turned on at the end of each read out interval to discharge C30 and cause it to go back to its zero signal condition.

In the embodiment shown in FIG. 9, each pixel includes a photodetector 12 responsive to a laser pulses 15 to produce signals applied to the input of laser pulse responsive circuit 11. Circuit 11 produces an electric pulse 13 corresponding to each light pulse detected by circuit 11. The output of circuit 11 is coupled to the input of a digital counter 173 which counts the occurrence of each electrical pulse 13 corresponding to each detected laser pulse 15. The output of counter 173 may be coupled to a digital to analog (D/A) converter 175 which converts the accumulated count to a DC voltage which is then coupled to one end of the conduction path of a gating transistor TX. When the corresponding row transistor TX associated with the pixel is energized (turned-on or selected) and the corresponding column transistor TY is also energized (turned-on or selected), the voltage at the output of D/A converter 175, corresponding to the number of light pulses, sensed during a sensing interval, is read out.

In the embodiments shown in FIG. 7 or 8, the voltage change across the capacitor C30 is not linear because different amounts of charge are removed (or added) corresponding to each succeeding light pulse that is detected. However, the output can be calibrated as a function of the number of pulses exceeding the reference threshold voltage. Thus, the voltage read out from the pixel is an analog representation of the pulse "count". For example, the first pulse causes a change of ~0.2 volt; the second pulse causes a change of 0.18 volt; the third pulse causes a change of 0.16 volt; the fourth pulse causes a change of 0.14 volt; etc . . . Even though the voltage steps are not linear, the system is calibrated to recognize that for a voltage of 0.2 volt, a single light pulse was sensed, for a voltage of 0.38 volts two light pulses were sensed, for a voltage of 0.52 volts 3 light pulses were sensed, etc. . . . The system is designed to recognize incremental values down to a few tens of millivolts, whereby in this embodiment a storage capacitor may be used to recognize the occurrence and sensing of, for example, 1 to 20 pulses. Thus, in system embodying the invention a pixel need not be read out after the sensing of each light pulse. Rather, each pixel may be read once per frame.

A significant advantage of counting multiple optical pulse within each pixel is that it reduces the frame rate required in order to detect multiple pulses. This is particularly significant in situations in which there are bursts of pulses closely spaced in time, separated by much longer intervals between bursts. Such pulse trains (see FIG. 5) occur in the remote control of guided missiles by light beams. In this example, a burst of up to 8 pulses spaced 30 microseconds apart may occur every 10 milliseconds.

By way of example assume that the image sensor is designed to sense a burst of up to 8 light pulses of 100 nanoseconds width, where the light pulses may occur at a repetition rate of 30 microseconds, with a burst every ten milliseconds.

The length of a sensing (sampling) interval may range from milliseconds to seconds depends on the application. The read-out time for each pixel may be very short and may range from less than 1 microsecond to several microseconds. This allows for the system to be very flexible.

Therefore, in the operation of an imager array, in accordance with the invention, there is a sampling (sensing or accumulation) interval and a read-out interval. The sampling interval may be selected to be long enough to include, for example, 10 pulses. Where a capacitor is being charged (or discharged), the accumulation interval should have a value such that the number of pulses causing the voltage to change can be easily detected.

Without intra-pixel pulse counting, to count the individual pulses, the pixel revisit (frame) time would need to be shorter than 30 microseconds, (~33 kHz frame rate). With intra-pixel pulse counting the readout time can be nearly 10 milliseconds, (~100 frames/sec). This is 300 times slower, while achieving the same high pulse rate counting fidelity.

It is much easier to implement an image sensor to operate at lower frame rate and correspondingly lower video bandwidth. As noted above, for an array of 100×100 pixels, at 33 kHz the pixel readout rate would be 330 MHz. In sharp contrast thereto, in accordance with the invention, operating at 100 frames per second the pixel rate is reduced to 1 MHz.

This reduction in bandwidth is a significant advantage in simplifying the design of a laser detection sensor system, and in minimizing its power consumption and size.

It should be noted that an application for the pulsed laser image sensor could include an aircraft concerned about being targeted by laser guided missiles. Not knowing the direction of the laser, a wide field of view must be under continuous surveillance. This requires several imaging arrays, each having a large number of pixels.

What is claimed is:

1. An imager comprising:
   a matrix array of light responsive elements (pixels) arranged in rows and columns with at least one row conductor per row of the matrix and at least one column conductor per column of the matrix for selectively accessing each pixel; and
   each pixel of the matrix array including: (a) a photodetector for detecting light pulses incident on the pixel; (b) signal processing circuitry coupled to the photoconductor and responsive to each optical pulse having an amplitude and duration greater than a predetermined value for producing a corresponding electrical pulse having a rising edge and a falling edge, and said signal processing circuitry including means responsive to at least one of the rising and falling edges of said corresponding electrical pulse having certain minimum conditions for producing a fixed predefined signal; and (c) circuitry for counting the number of said fixed predefined signals produced during a sampling interval for counting the corresponding number of light pulses detected during a sampling interval and for storing information pertaining to the number of light pulses detected.

2. An imager as claimed in claim 1, wherein each pixel of a row is coupled to a corresponding column conductor via a switchable row transistor and wherein each pixel includes analog circuitry for developing a voltage whose amplitude is indicative of the number of light pulses incident on the photodetector of the pixel during a sampling interval.

3. An imager as claimed in claim 1, wherein said means for producing fixed predefined signals includes circuitry for producing a unit of charge corresponding to each detected light pulse, and wherein the circuitry for counting the number of light pulses and for storing the information pertaining to the number of light pulses detected includes an output capacitor for measuring the number of units of charge produced during the sampling interval.

4. An imager as claimed in claim 3, wherein the output capacitor is discharged by a predetermined voltage increment each time a light pulse is detected.

5. An imager as claimed in claim 4, wherein the information stored in the capacitor is read out and the capacitor is then recharged to a fixed level zero count level condition.

6. An imager as claimed in claim 3, wherein the output capacitor is charged by a predetermined voltage increment each time a light pulse is detected.

7. An imager as claimed in claim 6, wherein the information stored in the capacitor is read out and the capacitor is then discharged to a fixed level zero count level condition.

8. An imager as claimed in claim 1, wherein the circuitry for counting the number of light pulses and for storing the information includes a digital counter.

9. An imager comprising:
  a matrix array of light responsive elements (pixels), formed on a common integrated circuit substrate, arranged in rows and columns with at least one row conductor per row of the matrix and at least one column conductor per column of the matrix for selectively accessing each pixel and
  each pixel of the matrix array including: (a) a photodetector for detecting light pulses incident on the pixel and producing an output signal indicative of an incident light pulse; (b) signal processing circuitry coupled to the photodetector and responsive to its output signal for generating a corresponding electrical pulse having a rising edge and a falling edge and a pulse width corresponding to each incident light pulse, said signal processing circuitry including means responsive to at least one of said rising edge, falling edge and pulse width having at least a minimum condition for producing an output pulse indicative thereof; and (c) counting circuitry coupled to said signal processing circuitry for counting the number of said output pulses produced during a sampling interval and thereby counting the incident light pulses and storing information corresponding to the count.

10. An imager as claimed in claim 9, wherein a row conductor per row of the matrix and a column conductor per column of the matrix for selectively accessing each pixel includes a gating transistor for each pixel, each gating transistor having a conduction path connected between its pixel and a corresponding column conductor, the gating transistors of the pixels of a row being coupled to the row conductor of that row and being responsive to signals applied to the row conductor for enabling the readout of the information stored within the pixel onto the corresponding column conductor.

11. An imager as claimed in claim 10 further including: (a) means for selectively enabling the row conductors of the matrix, one row at a time, for reading out the contents of the pixels of each row, one row at a time, onto their corresponding column conductors; and (b) means, following each read out of a pixel, for resetting each pixel to an initial signal condition.

12. An imager as claimed in claim 11 wherein said means for selectively enabling the row conductors of the matrix also includes means for determining the length of a sensing period during which each pixel detects light pulses incident on the pixel; and wherein the sensing period of a row is terminated by reading the contents of the pixels of a row.

13. An imager as claimed in claim 10, wherein said row and column conductors enable the read-out of the contents of each pixel of the array, one row at a time, after a predetermined sampling interval; and wherein each pixel also includes means for resetting the pixel to a zero level condition following each read out of the contents of the pixel.

14. An imager as claimed in claim 10, wherein the signal processing circuitry includes an amplifier stage coupled to the photodetector, a high pass filter coupled to the output of the amplifier stage and a threshold detector coupled to the filter for producing said output pulse corresponding to each incident light pulse having a predetermined energy level, and wherein each one of said output pulse has a fixed value.

15. An imager as claimed in claim 14, wherein said counting circuitry coupled to said signal processing circuitry for counting and storing the number of incident light pulses includes an analog counter for counting each one of said output pulses of fixed value.

16. An imager as claimed in claim 15 wherein said analog counter includes an output capacitor across which is applied said output pulses of fixed value to develop a signal voltage having an amplitude corresponding to the number of light pulses incident on its corresponding photodetector.

17. An imager as claimed in claim 16, wherein the output capacitor is discharged by a predetermined voltage level each time a light pulse is detected by its corresponding pixel.

18. An imager as claimed in claim 17, wherein following the read out of the information stored in the output capacitor, the output capacitor is then recharged to a fixed level zero count level condition.

19. An imager as claimed in claim 16, wherein the output capacitor is charged by a predetermined voltage level each time a light pulse is detected by its corresponding pixel.

20. An imager as claimed in claim 19, wherein following the read out of the information stored in the output capacitor, the output capacitor is then discharged to a fixed level zero count condition.

21. An imager as claimed in claim 14, wherein said counting circuitry coupled to said signal processing circuitry for counting and storing the number of incident light pulses includes a digital counter.

22. A system for sensing light pulses comprising:
  a matrix array of light responsive elements (pixels), formed on an integrated circuit substrate, arranged in rows and columns with a row conductor per row of the matrix and a column conductor per column of the matrix for selectively accessing each pixel; each pixel of the matrix array including: (a) a photodetector for detecting light pulses incident on the pixel and producing an output signal indicative of an incident light pulse; (b) signal processing circuitry coupled to the photodetector and responsive to its output signal for generating a corresponding electrical pulse having a rising edge and a falling edge and a pulse width corresponding to each incident light pulse, said signal processing circuitry including means responsive to at least one of said rising edge, falling edge and pulse width having at least a minimum condition for producing an output pulse of fixed value indicative thereof; and (c) counting circuitry coupled to the signal processing circuitry for counting the number of said output pulses produced during a sensing interval and for storing information indicative of the number of light pulses incident on the photodector during said sensing period; and
  row and column decoders respectively coupled to the row and column conductors of the matrix array for: (a) selectively operating the pixels of the matrix array in a sensing mode during which each pixel of a row detects light pulses incident on the pixel during the sensing mode and stores information corresponding thereto; and (b) for operating the matrix array in a readout mode during which information stored in the pixels of the array are read out a row at time.

* * * * *